US012593648B2

(12) United States Patent　(10) Patent No.:　US 12,593,648 B2
Chiu et al.　(45) Date of Patent:　Mar. 31, 2026

(54) SEMICONDUCTOR WORKPIECE TRANSPORT POD

(71) Applicant: GUDENG PRECISION INDUSTRIAL CO., LTD., New Taipei City (TW)

(72) Inventors: Ming-Chien Chiu, New Taipei City (TW); Chia-Ho Chuang, New Taipei City (TW); Kuo-Hua Lee, New Taipei City (TW); Jyun-Ming Lyu, New Taipei City (TW)

(73) Assignee: GUDENG PRECISION INDUSTRIAL CO., LTD., New Taipei City (TW)

( * ) Notice: Subject to any disclaimer, the term of this patent is extended or adjusted under 35 U.S.C. 154(b) by 0 days.

(21) Appl. No.: 18/810,559

(22) Filed: Aug. 21, 2024

(65) Prior Publication Data

US 2025/0253178 A1　Aug. 7, 2025

Related U.S. Application Data

(60) Provisional application No. 63/550,048, filed on Feb. 6, 2024.

(51) Int. Cl.
H10P 72/10　(2026.01)
G03F 7/00　(2006.01)

(52) U.S. Cl.
CPC ...... H10P 72/1924 (2026.01); G03F 7/70741 (2013.01); H10P 72/1922 (2026.01)

(58) Field of Classification Search
CPC ......... H01L 21/67376; H01L 21/67386; H01L 21/67369; H01L 21/67389; H10P 72/1924; H10P 72/1922; G03F 7/70741
USPC .......................... 206/710–712, 832; 220/378
See application file for complete search history.

(56) References Cited

U.S. PATENT DOCUMENTS

| | | | | |
|---|---|---|---|---|
| 6,354,601 | B1 * | 3/2002 | Krampotich | H01L 21/67376 220/795 |
| 7,413,099 | B2 * | 8/2008 | Takahashi | B65D 53/02 277/648 |
| 8,292,081 | B2 * | 10/2012 | Sasaki | H01L 21/67376 206/710 |
| 10,475,680 | B2 * | 11/2019 | Huang | H01L 21/67386 |
| 11,211,275 | B2 * | 12/2021 | Ogawa | H01L 21/67376 |
| 11,302,548 | B2 * | 4/2022 | Ogawa | F16J 15/10 |
| 2003/0116572 | A1 * | 6/2003 | Klock | A47J 36/027 220/373 |
| 2006/0081635 | A1 * | 4/2006 | Matsutori | H01L 21/67769 220/806 |
| 2007/0095849 | A1 * | 5/2007 | Kim | B65D 51/1683 220/806 |
| 2009/0261533 | A1 * | 10/2009 | Inoue | H01L 21/67376 277/648 |

(Continued)

*Primary Examiner* — Chun Hoi Cheung

(57)　ABSTRACT

A semiconductor workpiece transport pod includes: a lower container, having a top opening; an upper cover, having at least one lateral surrounding groove; and at least one airtight strip, having a base and at least one skirt, the base accommodated in the lateral surrounding groove, the skirt connected to the base and extending outward. When the upper cover is joined with the top opening of the lower container, the skirt of the airtight strip is elastically bent and presses tightly against an inner sidewall of the lower container to form airtightness.

14 Claims, 13 Drawing Sheets

(56)  References Cited

U.S. PATENT DOCUMENTS

| 2015/0262853 A1* | 9/2015 | Lin ................... | H01L 21/67376 |
| | | | 206/213.1 |
| 2019/0019704 A1* | 1/2019 | Gallagher ......... | H01L 21/67369 |
| 2021/0109439 A1* | 4/2021 | Eggum .................... | G03F 1/66 |
| 2022/0291596 A1* | 9/2022 | Chiu ................... | G03F 7/70741 |

* cited by examiner

SEMICONDUCTOR WORKPIECE TRANSPORT POD

CROSS-REFERENCE TO RELATED APPLICATION

This non-provisional application claims priority under 35 U.S.C. § 119(e) on U.S. provisional Patent Application No. 63/550,048 filed on Feb. 6, 2024, the entire contents of which are hereby incorporated by reference.

BACKGROUND OF THE INVENTION

1. Field of the Invention

The present disclosure relates to a workpiece transport pod, and in particular to a semiconductor workpiece transport pod capable of accommodating a semiconductor workpiece for transportation.

2. Description of the Related Art

Current semiconductor workpieces, for example, semiconductor transport carriers such as front opening unified pod (FOUP), reticle carriers, substrate carriers and board carriers or related parts, are packaged by clean bags or cardboard boxes during transportation.

BRIEF SUMMARY OF THE INVENTION

However, the approach of employing clean bags or cardboard boxes faces the following issues.

First of all, neither the clean bags nor the cardboard boxes have sufficient tightness, and both are unable to keep semiconductor workpieces clean over an extended period of time and are susceptible to contamination. Neither the clean bags nor the cardboard boxes can be repeatedly used, causing issues of difficulties in cost reduction and failure to meet environmental protection over extended use. Moreover, neither the clean bags nor the cardboard boxes are able to provide semiconductor workpieces accommodated therein with good protection, such that the semiconductor workpieces can easily encounter bruises during transportation.

Secondly, due to material properties, the clean bags can easily generate volatile organic compounds (VOC), and a low-humidity state cannot be kept within the bags for an extended period of time.

In view of the drawbacks above, with dedicated research and development, the applicant provides a semiconductor workpiece transport pod which has good tightness and is capable of maintaining cleanliness and a low-humidity state within the pod.

In addition, the semiconductor workpiece transport pod has good structural strength and is thus capable of providing semiconductor workpieces accommodated in the pod with good protection, and can be repeatedly used.

Moreover, the semiconductor workpiece transport pod does not generate any volatile organic compounds.

The directional or similar terms used throughout the present disclosure, for example, "front", "back/rear", "left", "right", "up/upper/top", "down/lower/bottom", "in/inner", "out/outer" and "side surface", are primarily provided with reference to the directions shown in the drawings. These directional or similar terms are intended to assist in describing and better understanding various embodiments of the present disclosure and are not to be construed as limitations to the present disclosure.

The articles "a/an" and "one" used for the elements and components described throughout the present disclosure are merely for the ease of use and to provide common meanings of the scope of the present disclosure, and should be interpreted as "one" or "at least one" in the present disclosure. Moreover, the concept of a singular form also includes cases of plural forms, unless otherwise specified.

Similar terms including "join", "combine" or "assemble" used throughout the present disclosure primarily include forms which can be separated without sabotaging the components or contain inseparable components once connected, and can be selected by a person skilled in the art according to materials or assembly requirements of the components to be connected.

To achieve the above and other objects, the present disclosure provides a semiconductor workpiece transport pod, including: a lower container, having a top opening; an upper cover, having at least one lateral surrounding groove; and at least one airtight strip, having a base and at least one skirt, the base accommodated in the lateral surrounding groove, the skirt connected to the base and extending outward. When the upper cover is joined with the top opening of the lower container, the skirt of the airtight strip is elastically bent and presses tightly against an inner sidewall of the lower container to form airtightness.

In the semiconductor workpiece transport pod above, the upper cover has an surrounding edge and a lower protrusion. The surrounding edge can cover a top edge of the lower container, the lower protrusion can extend downward from the surrounding edge, and the lateral surrounding groove can be disposed at a periphery of the lower protrusion.

In the semiconductor workpiece transport pod above, the upper cover can have an overhead hoist transfer (OHT) chuck, and the OHT chuck can protrude from a top surface of the lower protrusion.

In the semiconductor workpiece transport pod above, the lower protrusion and the OHT chuck can be connected and formed integrally, the upper cover can have a flat portion, and the OHT chuck can be located at a central position of the flat portion.

In the semiconductor workpiece transport pod above, the lower container can have a plurality of first stacking portions, the upper cover can have a plurality of second stacking portions, and the plurality of first stacking portions and the plurality of second stacking portions can be matched with and stacked on one another such that a plurality of the semiconductor workpiece transport pods having a same structure can be stacked up and stand on one other.

In the semiconductor workpiece transport pod above, the skirt of the airtight strip can be two in quantity, and the two skirts are vertically spaced from each other. When the upper cover is joined with the top opening of the lower container, a second distance is present between an outer surface of the base and the inner sidewall of the lower container. When the two skirts of the airtight strip are not bent, a third distance is present between free ends of the two skirts, wherein the third distance can be greater than or equal to the second distance.

In the semiconductor workpiece transport pod above, the skirt can have a sloped surface which can rise relative to a horizontal surface of the base.

In the semiconductor workpiece transport pod above, the lower container has an accommodating chamber therein, the upper cover can be provided with an air valve assembly, and a portion of the air valve assembly can be inserted into the accommodating chamber and is operable to discharge air in the accommodating chamber or provide airtightness.

In the semiconductor workpiece transport pod above, the air valve assembly can include an air valve mouth and an air valve plug, and opening or closing of the air valve plug is operable to control air discharge or airtightness of the air valve mouth.

In the semiconductor workpiece transport pod above, the air valve mouth can have a channel in communication with the accommodating chamber, a surrounding wall of the channel can be provided with a plurality of notches, the air valve plug is operable to coordinate with the channel so as to be opened or provide airtightness, and a total length of the channel can be less than a total length of the air valve plug.

In the semiconductor workpiece transport pod above, a sidewall of the lower container can be expanded in an inclined manner from bottom to top for stacking a plurality of the lower containers having a same structure.

In the semiconductor workpiece transport pod above, the lower container can have at least one parts placement region therein.

In the semiconductor workpiece transport pod above, the lower container can have at least one separator therein, and a material of the separator can be liquid crystal polymer (LCP), cyclo olefin polymer (COP) or metal.

The semiconductor workpiece transport pod above can further include a plurality of fastening structures, which can be disposed around a junction between the upper cover and the lower container and are operable to lock, open and close the upper cover and the lower container.

In the semiconductor workpiece transport pod above, a material of each of the lower container and the upper cover can be LCP, COP or metal.

Accordingly, the semiconductor workpiece transport pod of the present disclosure allows the skirt of the airtight strip to be gradually bent upward during a process of joining the upper cover to the top opening from top to bottom. Moreover, once the upper cover is joined to a fixed position, the skirt can be kept pressing tightly against the inner sidewall of the lower container such that the upper cover can seal the top opening with airtightness, so as to maintain cleanliness and humidity within the pod. On the other hand, the semiconductor workpiece transport pod of the present disclosure provides optimal ease for extracting air from inside to outside of the pod through the air valve assembly so as to reduce oxygen and humidity within the pod, hence providing a semiconductor workpiece within the pod with a better storage environment.

DETAILED DESCRIPTION OF THE INVENTION

To facilitate understanding of the object, characteristics and effects of the present disclosure, embodiments together with the attached drawings for the detailed description of the present disclosure are provided below.

Figure 1:
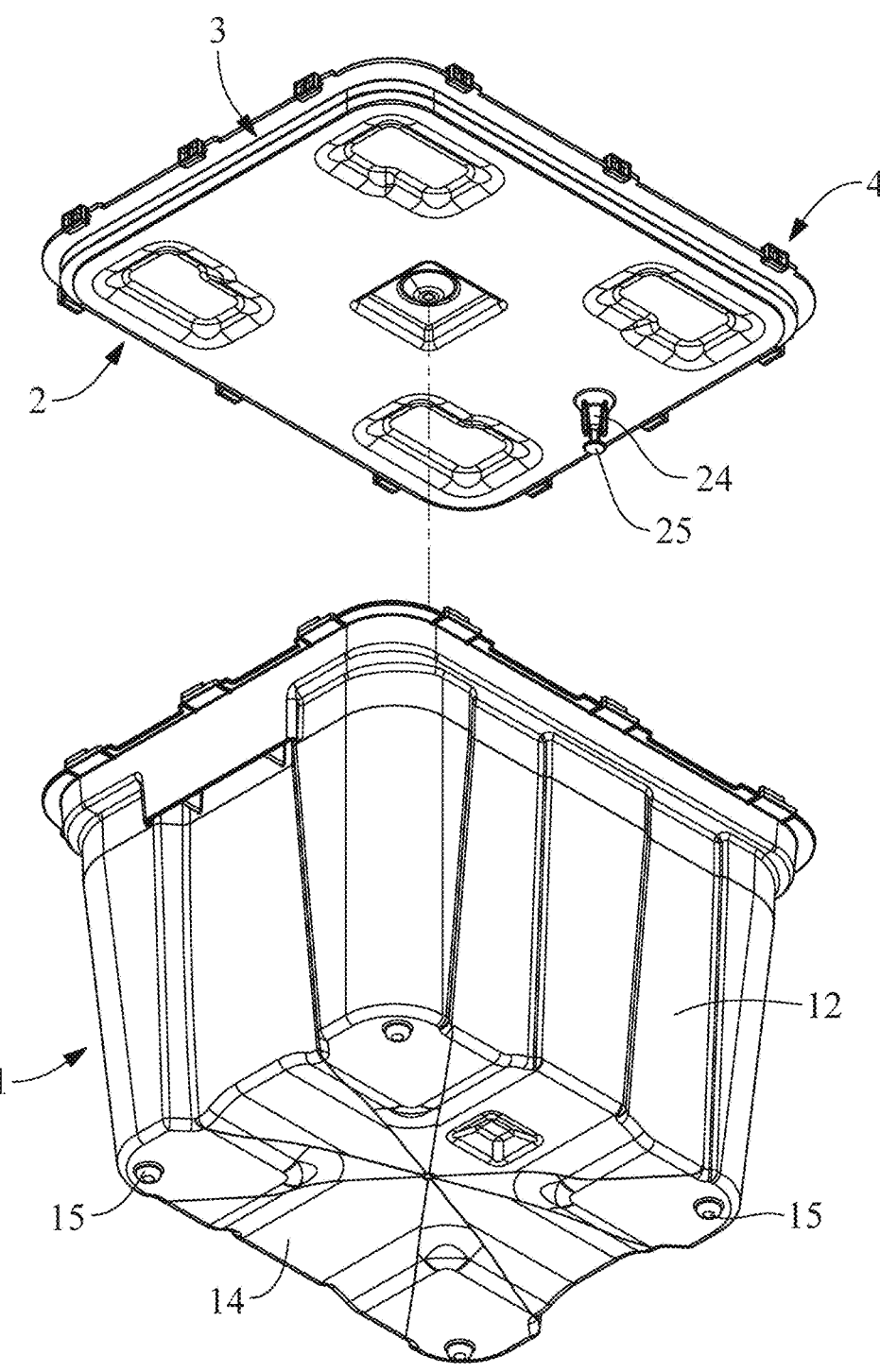
FIG. 1 is a perspective schematic diagram according to an embodiment of the disclosure.
Figure 2:
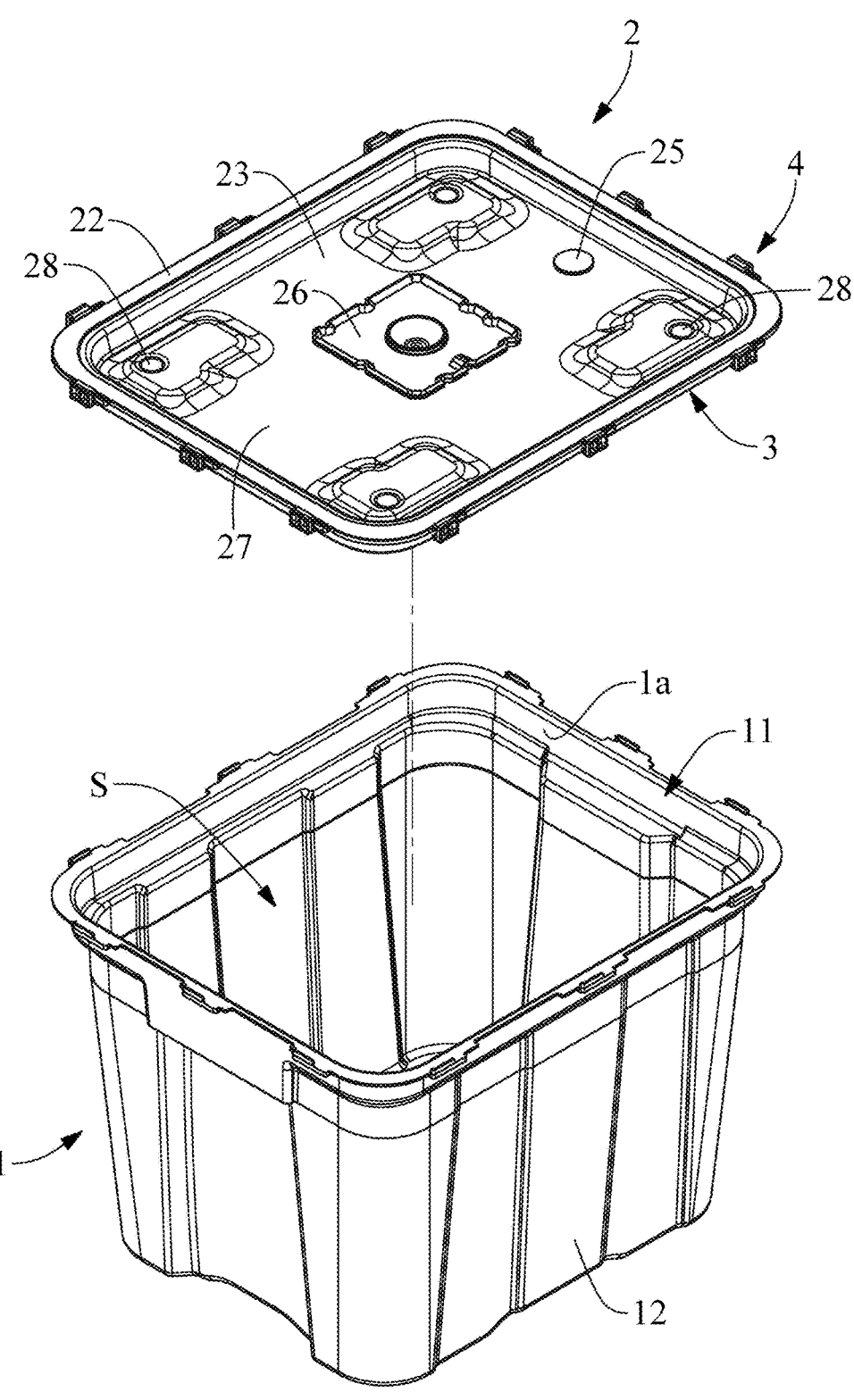
FIG. 2 is an exploded perspective schematic diagram from another angle of view according to an embodiment of the disclosure.
Figure 3:
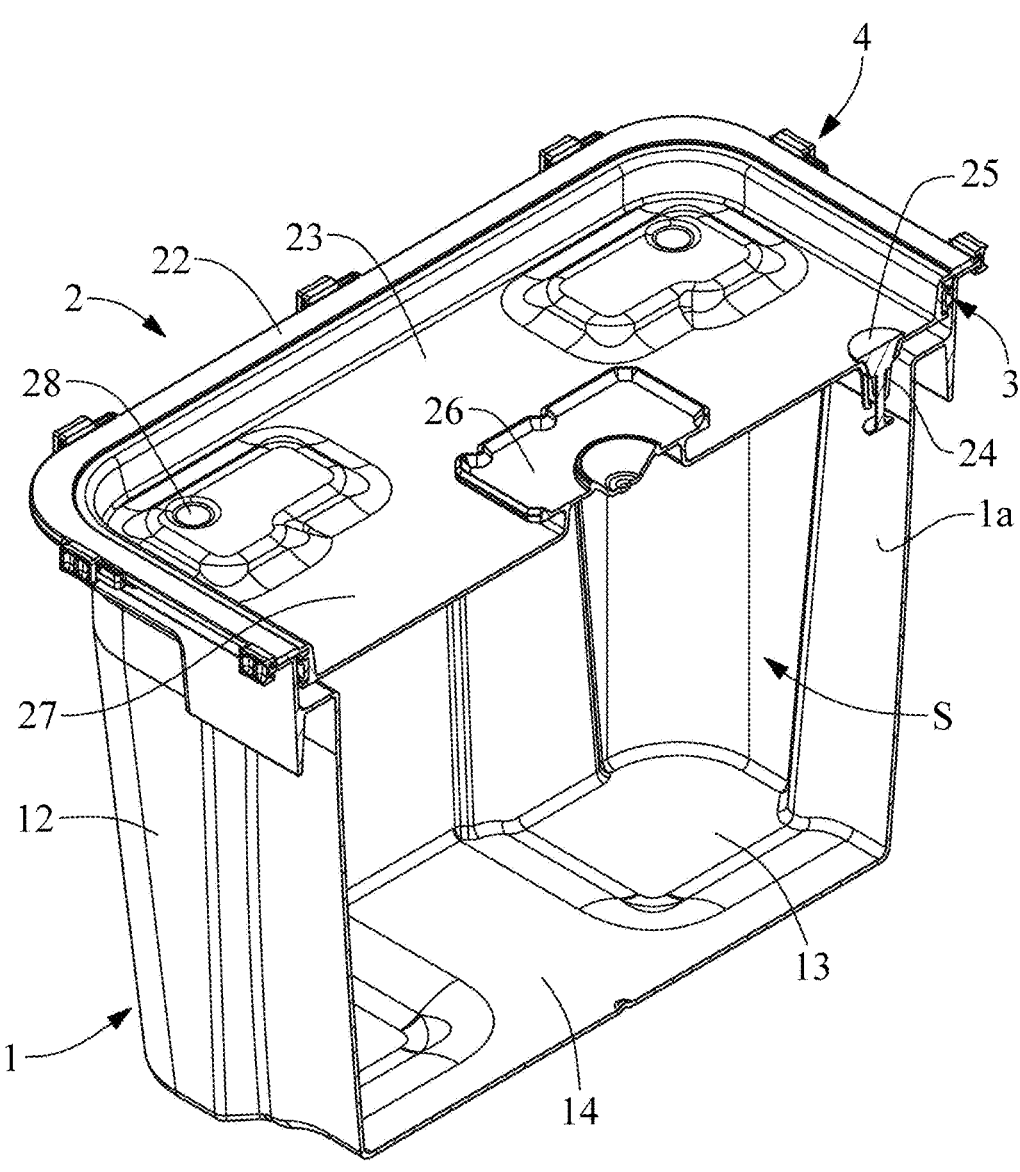
FIG. 3 is a perspective assembly cross-sectional schematic diagram according to an embodiment of the disclosure.

Refer to FIG. 1 to FIG. 3 showing a semiconductor workpiece transport pod according a preferred embodiment of the present disclosure. The semiconductor workpiece transport pod includes a lower container 1, an upper cover 2 and at least one airtight strip 3. The airtight strip 3 is joined with the upper cover 2, and the upper cover 2 can be openably joined with the lower container 1.

Figure 4:
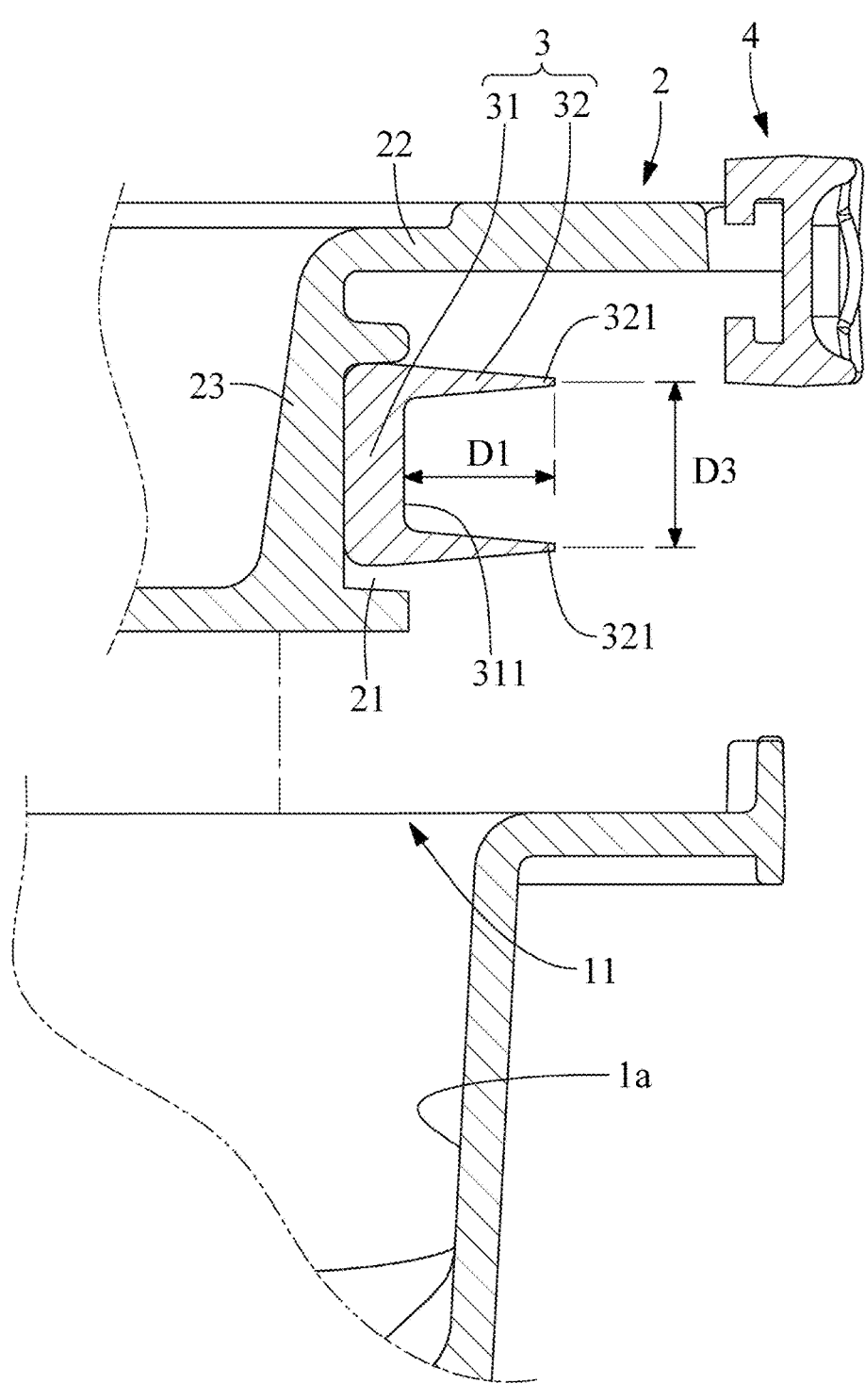
FIG. 4 is a partial cross-sectional schematic diagram when an upper cover is not yet joined with a lower container according to an embodiment of the disclosure.

More specifically, referring to FIG. 2 to FIG. 4, the lower container 1 has an accommodating chamber S therein, and has a top opening 11 in communication with the accommodating chamber S so as to place a semiconductor workpiece into the accommodating space S or take out the semiconductor workpiece from the accommodating space S through a top of the lower container 1. The upper cover 2 has at least one lateral surrounding groove 21, the airtight strip 3 has a base 31 and at least one skirt 32, the base 31 is accommodated in the lateral surrounding groove 21, and the skirt 32 is connected to the base 31 and extends outward. The upper cover 2 is operable to seal the top opening 11 of the lower container 1, and the lateral surrounding groove 21 of the upper cover 2 is located within the lower container 1 once the upper cover 2 is joined with the lower container 1.

Figure 5:
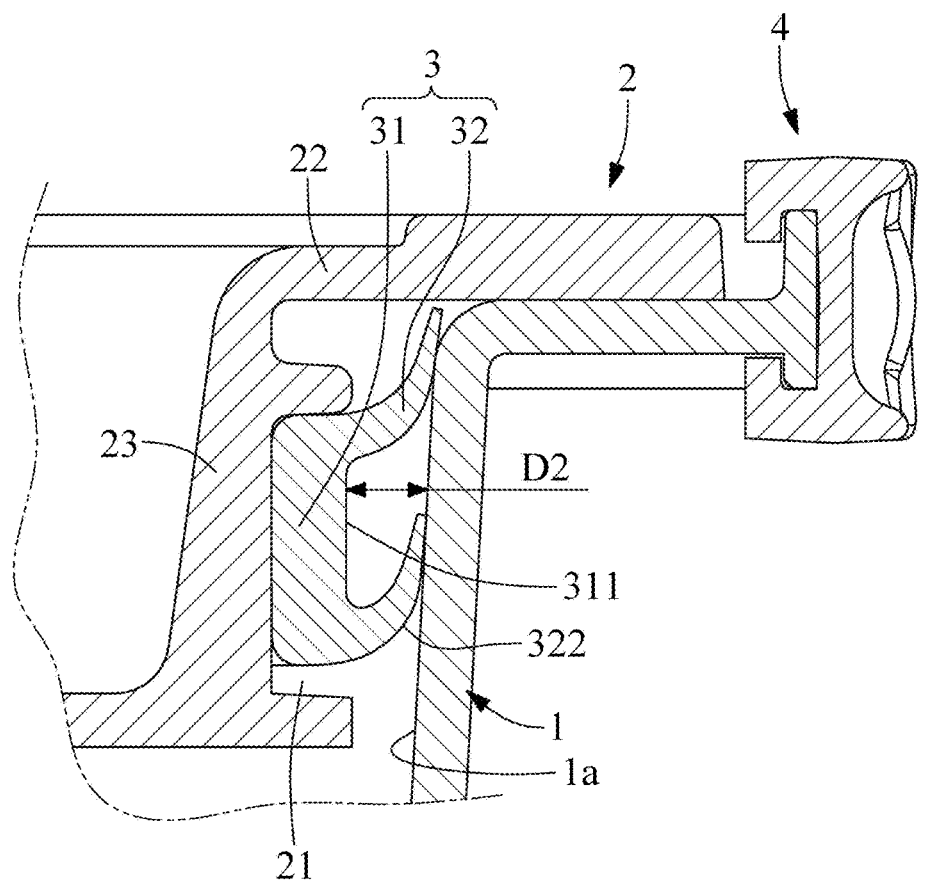
FIG. 5 is a partial cross-sectional schematic diagram when an upper cover is joined with a lower container according to an embodiment of the disclosure.

Referring to FIG. 4 and FIG. 5, according to the structure above, during the process of joining the upper cover 2 from top to bottom to the top opening 11, the skirt 32 of the airtight strip 3 comes into contact with an inner sidewall 1a of the lower container 1. With a level of the upper cover 2 being pressed downward, the skirt 32 is partially attached to the inner sidewall 1a of the lower container 1 and is thus gradually elastically bent upward. Moreover, once the upper cover 2 is joined to a fixed position, the skirt 32 is kept tightly pressing against the inner sidewall 1a of the lower container 1 via an elastic restoration ability of the skirt 32, such that the upper cover 2 can seal the top opening 11 of the lower container 1 in an airtight manner, and cleanliness and humidity within the accommodating chamber S can be maintained over an extended period of time. In addition, a part of the skirt 32 that is elastically deformed and thus tightly presses against the inner sidewall 1a of the lower container 1 can further increase a contact area between the airtight strip 3 and the inner sidewall 1a of the lower container 1, hence effectively preventing the upper cover 2 from loosening from the lower container 1 and enhancing joining stability between the two.

More specifically, referring to FIG. 2 and FIG. 5, in one embodiment of the present disclosure, the upper cover 2 can have a surrounding edge 22 and a lower protrusion 23. The surrounding edge 22 is adapted to cover a top edge of the lower container 1, and the lower protrusion 23 can extend downward from an inner edge of the surrounding edge 22. When the upper cover 2 seals the top opening 11 of the lower container 1, the lower protrusion 23 slightly protrudes toward the accommodating chamber S, and the lateral surrounding groove 21 can be disposed at a periphery of the lower protrusion 23. Thus, the upper cover 2 of this embodiment can be easily manufactured and formed, while enhancing assembly convenience and joining stability of the upper cover 2, the lower container 1 and the airtight strip 3.

Referring to FIG. 4 and FIG. 5, in one embodiment of the present disclosure, the base 31 of the airtight strip 3 has an outer surface 311. When the skirt 32 of the airtight strip 3 is not bent, a first distance D1 is present between the outer surface 311 of the base 31 and a free end 321 of the skirt 32; when the upper cover 2 is joined with the top opening 11 of the lower container 1, a second distance D2 is present between the outer surface 311 of the base 31 and the inner sidewall 1a of the lower container 1, wherein the first distance D1 can be greater than the second distance D2. Thus, the airtight strip 3 of this embodiment ensures that the skirt 32 thereof can generate elastic deformation and tightly press against the inner sidewall 1a of the lower container 1.

Figure 6:
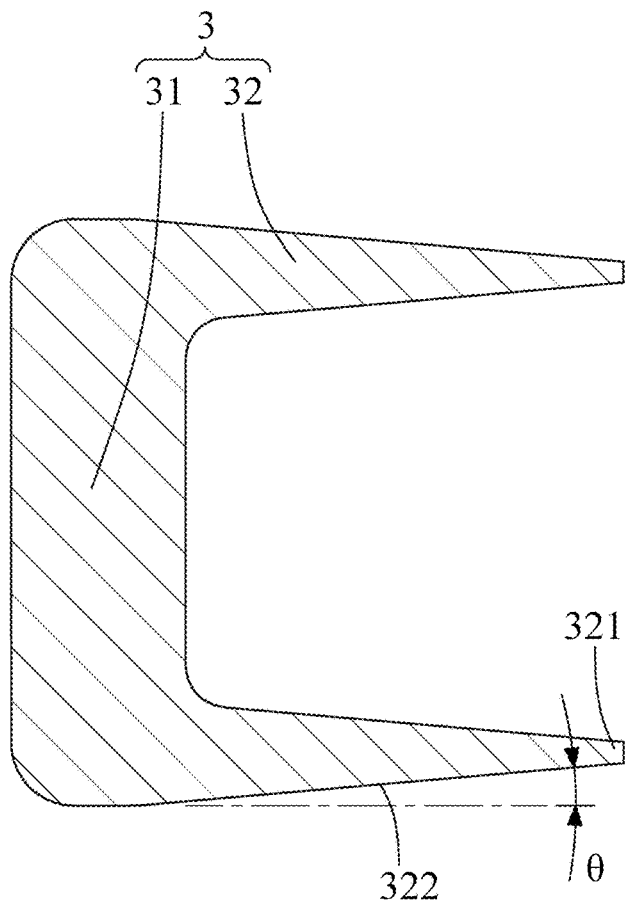
FIG. 6 is a side cross-sectional structural schematic diagram of an airtight strip according to an embodiment of the present disclosure.

Further referring to FIG. 5 and FIG. 6, in one embodiment of the present disclosure, the skirt 32 has a sloped surface 322. The sloped surface 322 rises relative to a horizontal surface of the base 31, that is, an included angle θ between the sloped surface 322 and the horizontal surface of the base 31 is greater than 0. Thus, the airtight strip 3 of this embodiment, with the skirt 32 rising at an appropriate level, ensures that the skirt 32 can generate elastic deformation in an expected direction during the process of joining the upper cover 2 to the lower container 1, and that the sloped surface 322 of the skirt 32 can tightly press against the inner sidewall 1a of the lower container 1.

Moreover, again referring to FIG. 4 and FIG. 5, in one embodiment of the present disclosure, the skirt 32 of the airtight strip 3 can be two in quantity, and the two skirts 32 can be vertically spaced from each other. Thus, with one airtight strip 3, there are two parts available to produce elastic deformation and tightly press against the inner sidewall 1a of the lower container 1, and this achieves an effect of enhancing airtightness of the semiconductor workpiece transport pod.

In one embodiment of the present disclosure, when the two skirts 32 of the airtight strip 3 are not bent, a third distance D3 is present between the free ends 321 of the two skirts 32, wherein the third distance D3 can be greater than or equal to the second distance D2. Thus, the airtight strip 3 of this embodiment can prevent the issue of poor airtightness caused by mutual interference between the two skirts 32 when the two skirts 32 are bent and deformed.

It should be noted that, in this embodiment, the lateral surrounding groove 21 of the upper cover 2 can be one in quantity to accommodate the base 31 of one single airtight strip 3. In other embodiments, the lateral surrounding groove 21 of the upper cover 2 can be plural in quantity, each of the plurality of the lateral surrounding grooves 21 can accommodate the base 31 of one airtight strip 3, and two adjacent lateral surrounding grooves 21 can be spaced vertically. Thus, the upper cover 2 can be assembled with a greater quantity of airtight strips 3, so as to further enhance airtightness of the semiconductor workpiece transport pod. For example, the lateral surrounding groove 21 can be selectively provided as two in quantity, so that the semiconductor workpiece transport pod is provided with good airtightness, and the upper cover 2 and the lower container 1 can be appropriately and stably joined without being too difficult to separate. Moreover, the upper cover 2 can be selectively formed to have different quantities of the lateral surrounding grooves 21 according to actual requirements so as to be arranged with a corresponding quantity of airtight strips 3, and is not limited to the form of being provided with one single lateral surrounding groove 21 or two lateral surrounding grooves 21 as described above.

Figure 7:
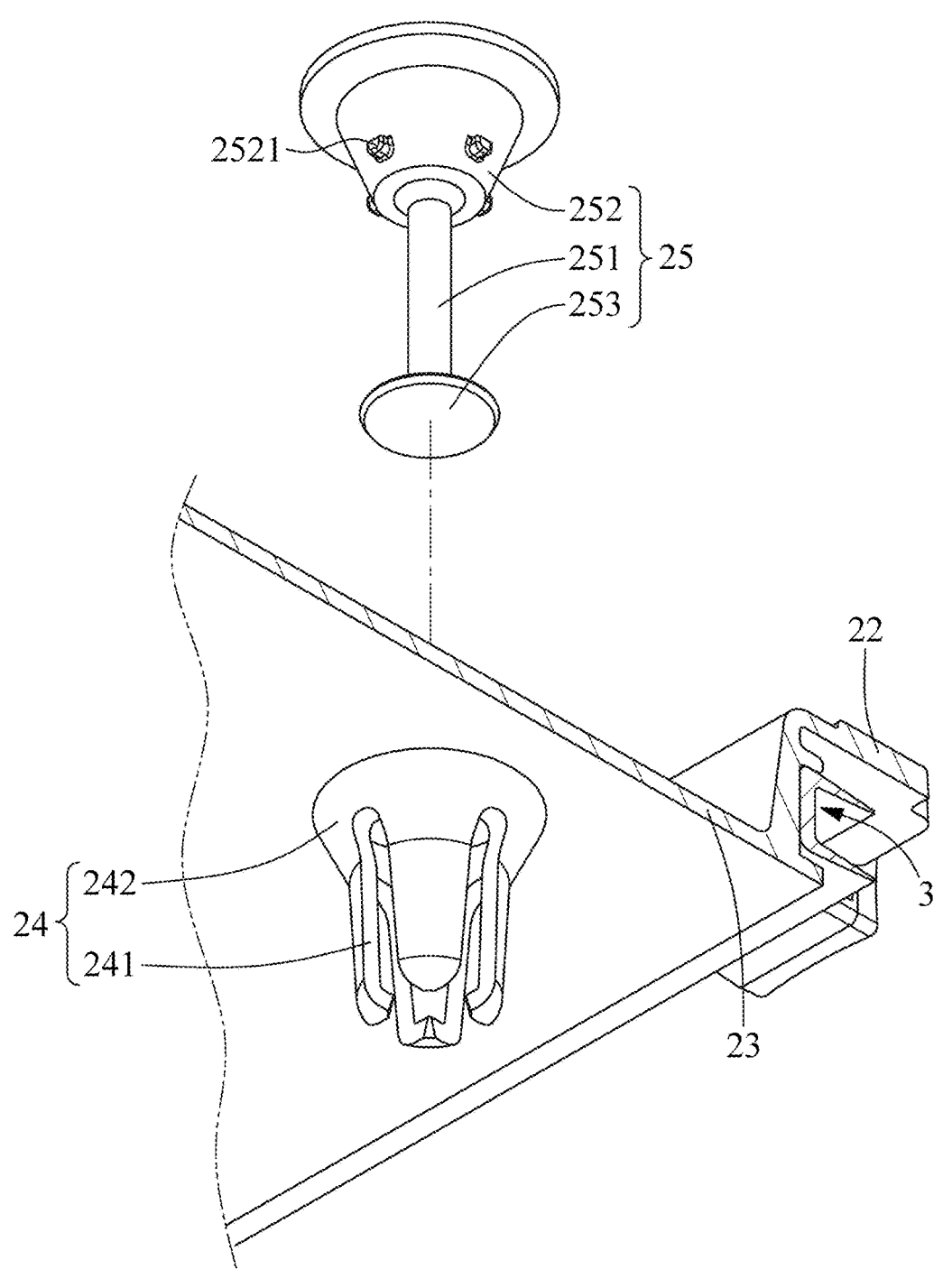
FIG. 7 is a partial perspective cross-sectional schematic diagram of an upper cover according to an embodiment of the disclosure.
Figure 8:
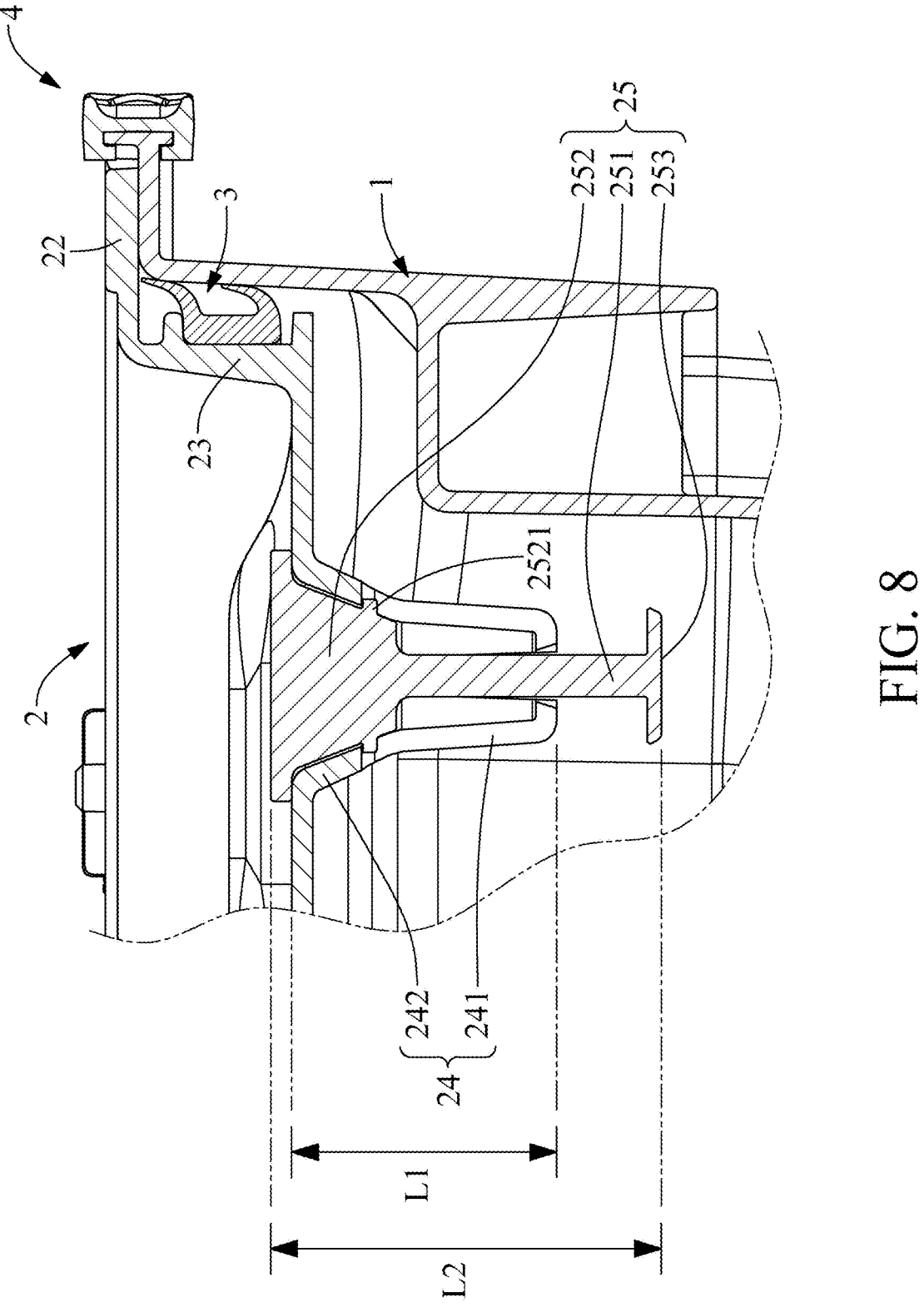
FIG. 8 is a partial assembly cross-sectional schematic diagram according to an embodiment of the disclosure, wherein an air valve plug is closed.
Figure 9:
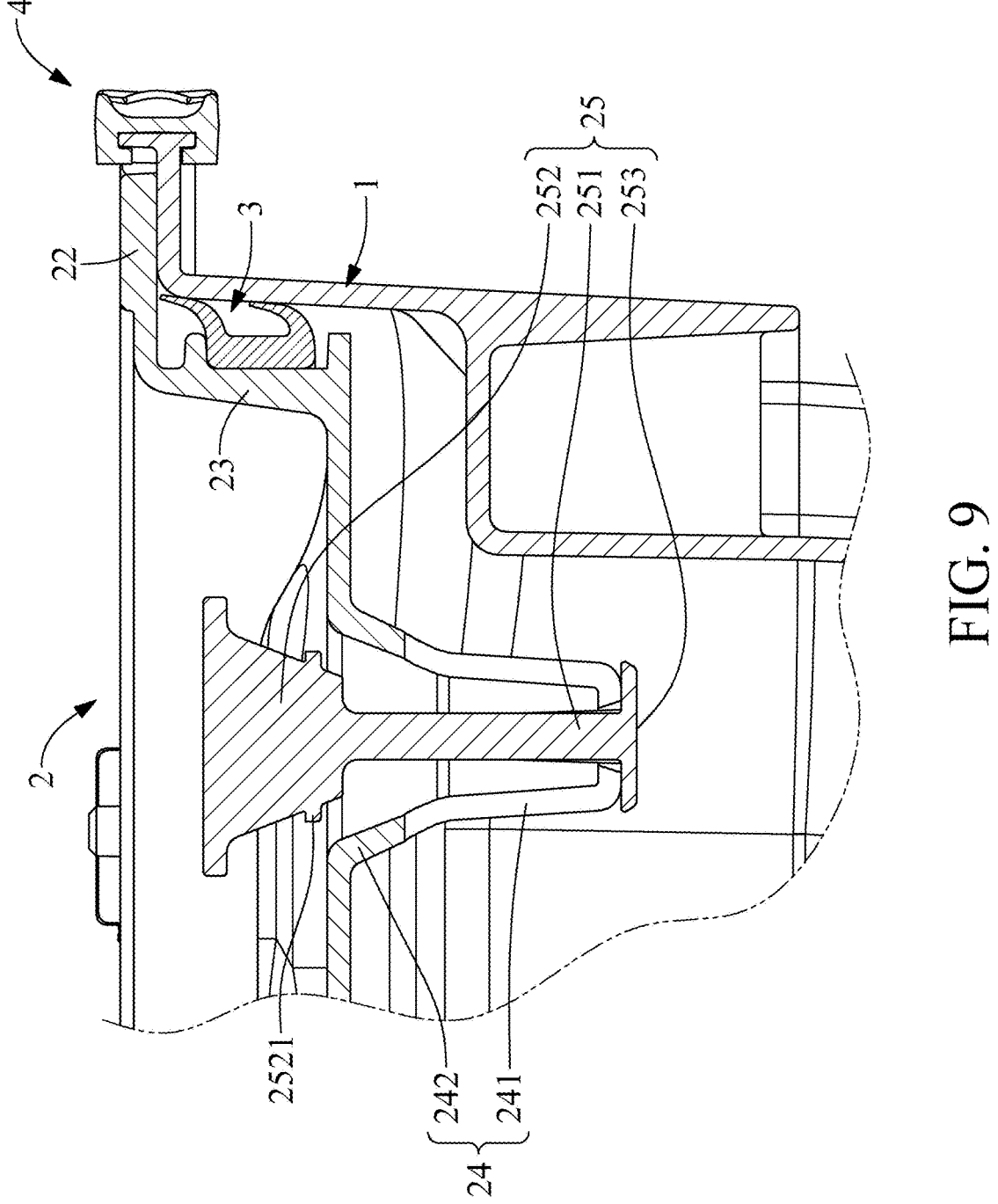
FIG. 9 is a partial assembly cross-sectional schematic diagram according to an embodiment of the disclosure, wherein an air valve plug is open.

On the other hand, referring to FIG. 3 and FIG. 7 to FIG. 9, in addition to the embodiments above, in one embodiment of the present disclosure, the upper cover 2 can be provided with an air valve assembly. The air valve assembly can include an air valve mouth 24 and an air valve plug 25, and a portion of the air valve assembly can be inserted into the accommodating chamber S and be operable to discharge air within the accommodating chamber S or provide airtightness. For example, the air valve mouth 24 can be connected to the lower protrusion 23 of the upper cover 2 and extend toward the accommodating chamber S. The air valve mouth 24 can have at least one ventilation opening 241, and the air valve plug 25 can be movably disposed at the air valve mouth 24 so as to selectively block the ventilation opening 241 of the air valve mouth 24. That is, when the air valve plug 25 is in a closed state (as shown in FIG. 8), the accommodating chamber S is not in communication with an exterior of the upper cover 2; when the air valve plug 25 is in an opened state (as shown in FIG. 9), the accommodating chamber S can be in communication with the exterior of the upper cover 2 through the ventilation opening 241. Thus, by controlling opening and closing of the air valve plug 25, the upper cover 2 of this embodiment can adjust humidity and airtightness within the accommodating chamber S while maintaining a state of being joined with the lower container 1. The present disclosure does not specifically define the form of the air valve mouth 24 and the air valve plug 25, provided that the effects above can be achieved in principle.

More specifically, in one embodiment of the present disclosure, the air valve mouth 24 can present a substantially tube-like shape and form a channel in communication with the accommodating chamber S therein, and further has a surrounding wall 242, and the ventilation opening 241 passes through inner and outer surfaces of the surrounding wall 242. For example but not limited to, the ventilation opening 241 can be in the form of a through hole, or can be in the form of a notch extending upward by a predetermined distance from a bottom end of the surrounding wall 242. In this embodiment, the ventilation opening 241 (a notch) can be selectively provided as plural in quantity, and the plurality of ventilation openings 241 are preferably distributed at equal angles at the surrounding wall 242. The surrounding wall 242 of the air valve mouth 24 can be integrally formed and connected to the lower protrusion 23 of the upper cover 2, or be additionally assembled and joined to a through hole at the lower protrusion 23, such is not specifically defined by the present disclosure.

The air valve plug 25 can have a rod 251, an elastic plug 252 and a stop piece 253. Two ends of the rod 251 are respectively connected to the elastic plug 252 and the stop piece 253, a lower end of the rod 251 passes through the surrounding wall 242 of the air valve mouth 24, and the stop piece 253 at least has a width which is partially greater than an inner diameter of the surrounding wall 242, so that the stop piece 253 can be kept out of the lower end of the surrounding wall 242. The elastic plug 252 can further include at least one block 2521, which protrudes from a surrounding peripheral surface of the elastic plug 252 and is located closer to the rod 251.

Accordingly, referring to FIG. 7 and FIG. 8, the elastic plug 252 of the air valve plug 25 can block an interior of the surrounding wall 242, such that the surrounding peripheral surface of the elastic plug 252 can be attached to an inner peripheral surface of the surrounding wall 242 to form a closed state of the air valve plug 25, so that the accommodating chamber S is prohibited from being in communication with the exterior of the upper cover 2 through the ventilation opening 241. The elastic plug 252 can selectively made of an elastic material (for example, rubber) so as to reinforce airtightness. Moreover, the block 2521 of the elastic plug 252 can extend into the corresponding ventilation opening 241 to assist positioning of the air valve plug 25 by the block 2521, so that the elastic plug 252 of the air valve plug 25 does not disengage from the air valve mouth 24 easily. In addition, the form of the elastic plug 252 can have a cone shape with a wide top and a narrow bottom, and an upper half of the surrounding wall 242 can also have a corresponding form so as to enhance the effect of tight attachment between the two. As shown in FIG. 8, a total length L1 of the channel of the air valve mouth 24 is less than a total length L2 of the air valve plug 25, so as to ensure that air discharge or airtightness of the air valve mouth 24 can be accurately controlled by opening or closing of the air valve plug 25.

Referring to FIG. 3 and FIG. 9, in practice, an air extraction device (for example, a vacuum machine) can be used to extract air out of the air valve mouth 24 from the outside of the upper cover 2. At this point in time, the air valve plug 25 originally in a closed state is attracted by the air extraction device and moves upward, such that the surrounding peripheral surface of the elastic plug 252 is no longer attached to the inner peripheral surface of the surrounding wall 242, hence forming an open state of the air valve plug 25. In the embodiment where the elastic plug 252 has the block 2521, the block 2521 detaches from the corresponding ventilation opening 241 due to elastic deformation generated as a result of a force received by the block 2521 during a process of the elastic plug 252 being attracted upward. Once the air valve plug 25 moves upward until the stop piece 253 abuts the lower end of the surrounding wall 242, the entire air valve plug 25 is prevented from detaching from the air valve mouth 24 by the stop piece 253. Thus, air within the accommodating chamber S can be extracted by the air extraction device through the ventilation opening 241, so as to form a low-oxygen, low-humidity and low-pressure environment within the accommodating chamber S.

Referring to FIG. 3 and FIG. 8, the air valve plug 25 can fall naturally once the air extraction device stops operating, or preferably is pressed by a downward pressure to return to the closed state, so as to maintain the low-oxygen, low-humidity and low-pressure environment within the accommodating chamber S. Meanwhile, the low-pressure environment within the accommodating chamber S can assist in enhancing tightness by which the upper cover 2 seals the top opening 11 of the lower container 1, so that the air valve plug 25 coordinating with the airtight strip 3 can jointly provide excellent airtightness, thereby maintaining the low-oxygen, low-humidity and low-pressure environment within the accommodating chamber S for even a more extended period of time, and ensuring external air from flowing into the accommodating space S and thus maintaining cleanliness of objects placed within the accommodating space S.

Moreover, the upper cover 2 can be provided with a humidity sensor extending into the accommodating space S to detect in real time humidity within the accommodating space S as a reference for whether the air extraction device is supposed to stop operating, and humidity within the accommodating space S can also be read in real time. In addition, before the upper cover 2 is to be opened, it is suggested that the air valve plug 25 be first switched to the opened state to discharge air naturally to reduce the degree of vacuum within the accommodating space S, so that the upper cover 2 can be more easily opened from above the lower container 1.

It should be noted that, in one embodiment of the present disclosure, each of the lower container 1 and the upper cover 2 can be made of a low moisture absorption material, for example, materials such as LCP and COP or a metal material. Thus, the lower container 1 and the upper cover 2 of this embodiment can effectively reduce volatile organic compounds generated and alleviate returning of humidity within the accommodating space S, thereby preventing semiconductor workpieces therein from contamination of the volatile organic compounds, as well as prolonging the time for which the low-humidity environment is maintained within the semiconductor workpiece transport pod. Moreover, both of the lower container 1 and the upper cover 2 can be repeatedly cleaned and used and also be baked dry to prevent any residual watermarks, and at the same time have good structural strength so as to enhance protection for semiconductor workpieces therein.

Figure 10:
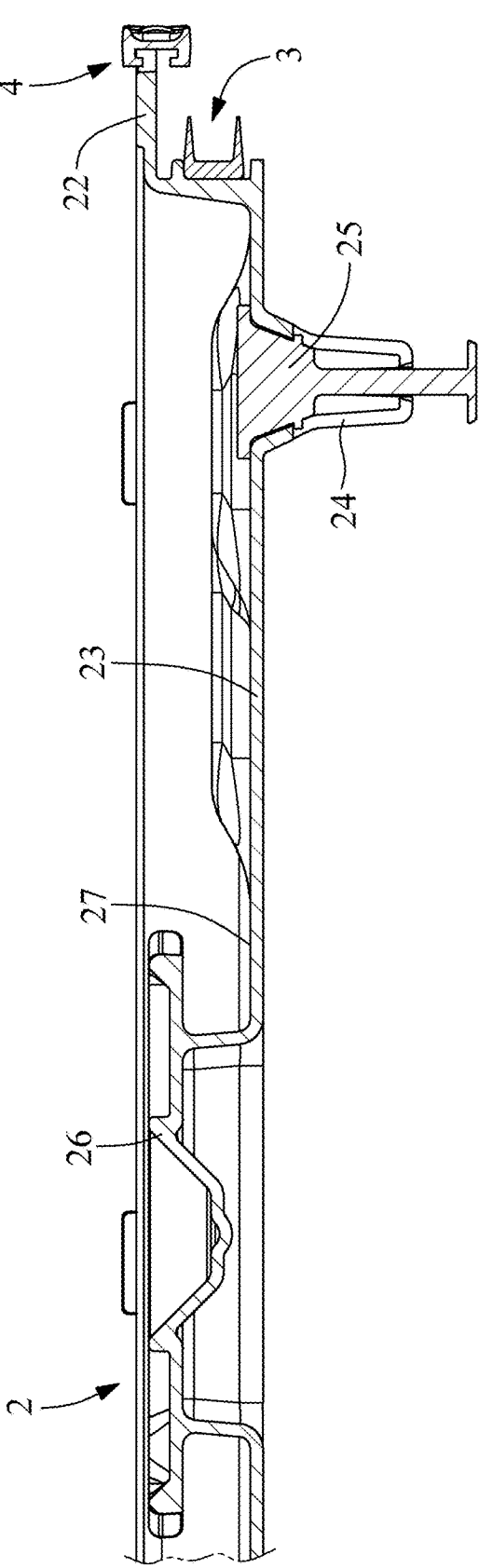
FIG. 10 is a partial cross-sectional schematic diagram of an upper cover according to an embodiment of the disclosure.

Referring to FIG. 2, FIG. 3 and FIG. 10, in addition to the embodiments above, in one embodiment of the present disclosure, the upper cover 2 has an overhead hoist transfer (OHT) chuck 26, which can protrude from a top surface of the lower protrusion 23. Thus, when the upper cover 2 is joined with the lower container 1, the OHT chuck 26 of the upper cover 2 can be clamped by an OHT system, so as to implement automatic conveyance and transportation of the semiconductor workpiece transport pod in this embodiment. The OHT chuck 26 can be assembled and joined to the lower protrusion 23, or as shown in FIG. 10, the OHT chuck 26 protruding upward is integrally formed at the lower protrusion 23 so as to reduce assembly time. The OHT chuck 26 is preferably selectively disposed at a central position of the upper cover 2, so as to allow the OHT system to more stably clamp the semiconductor workpiece transport pod.

Moreover, in the embodiment where the lower protrusion 23 and the OHT chuck 26 are integrally formed and connected, an upper surface of the upper cover 2 can have a flat portion 27, and the OHT chuck 26 can be located at a central position of the flat portion 27. Thus, the flat portion 27 facilitates a mold ejection process during manufacturing, so that the upper cover 2 having the OHT chuck 26 can be manufactured more easily and quickly.

Figure 11:
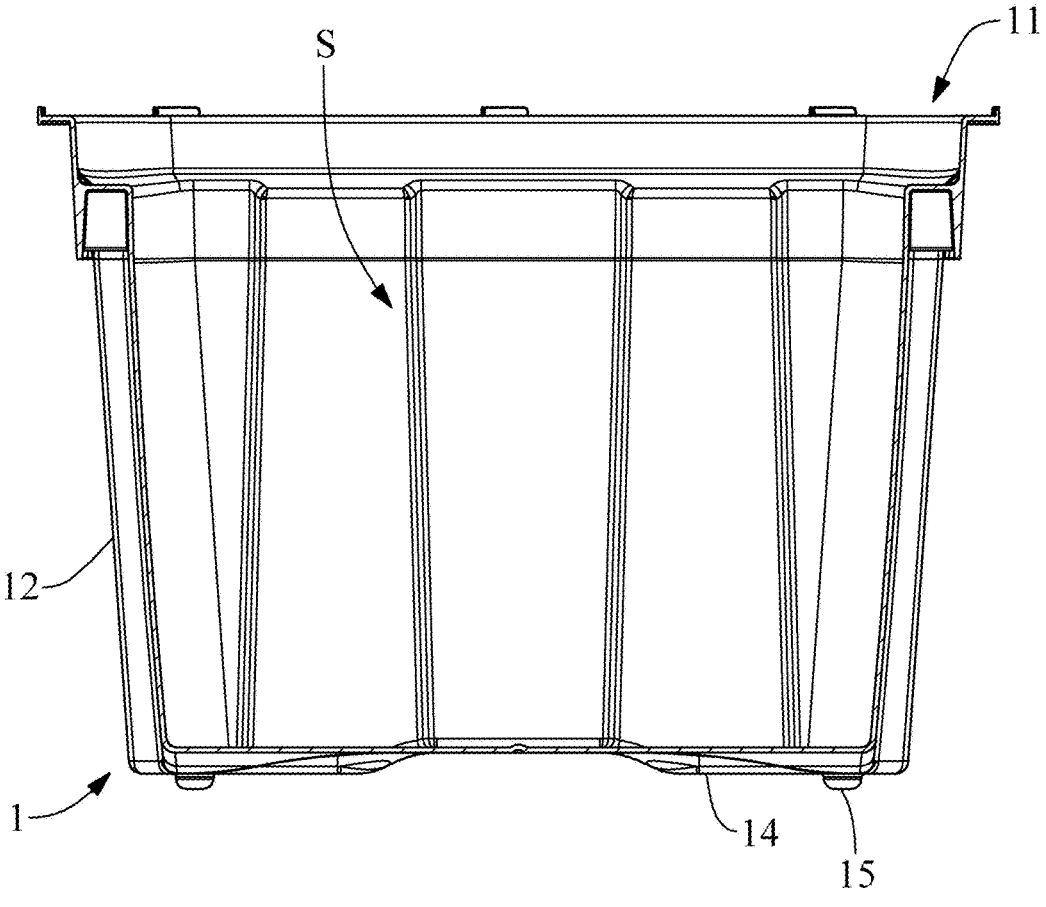
FIG. 11 is a side cross-sectional structural schematic diagram of a lower container according to an embodiment of the present disclosure.

Referring to FIG. 2 and FIG. 11, in addition to the embodiments above, in one embodiment of the present disclosure, a sidewall 12 of the lower container 1 can be expanded in an inclined manner from bottom to top. Thus, a plurality of the lower container 1 having the same structure can be stacked on each other and be stored, so as to reduce a storage space.

Moreover, in one embodiment of the present disclosure, the sidewall 12 of the lower container 1 can be formed as an undulating structure. Thus, the structure of the sidewall 12 can be reinforced to achieve an effect of being impact resistant.

Referring to FIG. 1 and FIG. 3, in addition to the embodiments above, in one embodiment of the present disclosure, the lower container 1 can further have at least one parts placement region 13 therein; for example but not limited to, the parts placement region 13 can be a local recess formed on a bottom panel 14 of the lower container 1, or a small box placed into the accommodating chamber S. Thus, the lower container 1 of this embodiment can be placed with parts, for example, a moisture-proof bag to reduce the humidity within the accommodating chamber S, a screw or a spare airtight strip 3.

Figure 12:
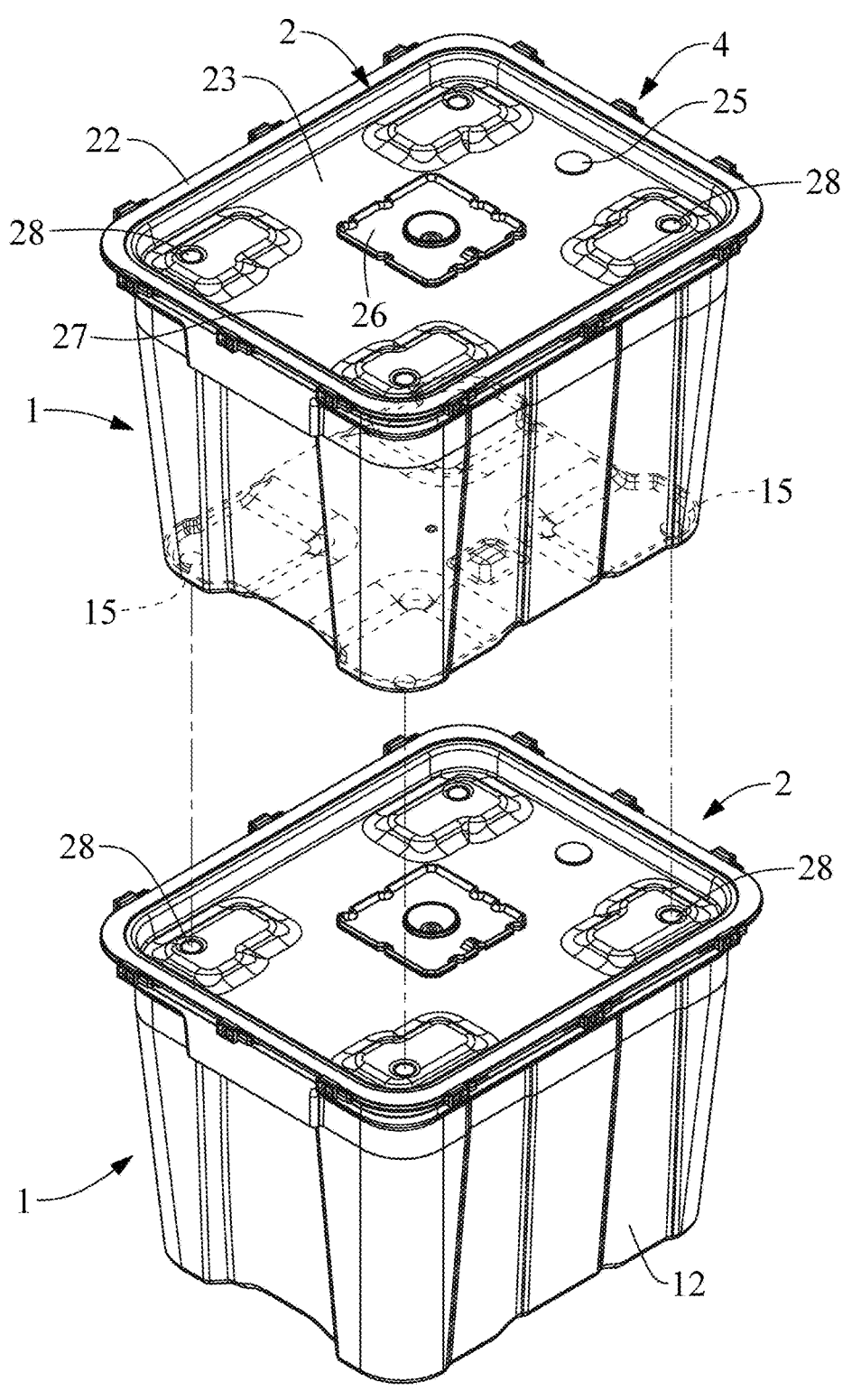
FIG. 12 is a perspective structural schematic diagram of a vertical stacking state according to an embodiment of the disclosure.

Referring to FIG. 1, FIG. 2 and FIG. 12, in addition to the embodiments above, in one embodiment of the present disclosure, the lower container 1 can have a plurality of first stacking portions 15, and the upper cover 2 can have a plurality of second stacking portions 28. Thus, when the upper cover 2 is fixed at the top of the lower container 1, the plurality of first stacking portions 15 and the plurality of second stacking portions 28 can be matched with and stacked on one another such that a plurality of the semiconductor workpiece transport pods having the same structure can be stacked up and stand on one other.

For example but not limit to, the plurality of first stacking portions 15 can be provided at the bottom panel 14 of the lower container 1, for example, as a plurality of bumps disposed on an outer bottom surface of the bottom panel 14, and can also at the same time be used as legs of the lower container 1; the plurality of second stacking portions 28 can be disposed on the upper surface of the upper cover 2, for example, a plurality of indentations recessed at the top surface of the lower protrusion 23. Thus, when two semiconductor workpiece transport pods are vertically stacked on each other, the plurality of first stacking portions 15 of the lower container 1 on the top can be inserted into the plurality of second stacking portions 28 of the upper cover 2 at the bottom. Moreover, a lower edge of the lower container 1 on the top can also be surrounded by the lower protrusion 23 in a recessed form. Thus, the semiconductor workpiece transport pod of this embodiment achieves an effect of secure vertical stacking. In other embodiments, the corresponding first stacking portions 15 and second stacking portions 28 can also be configured to have protruding and recessing structures opposite to those described above, or be configured to have equivalent structures capable of restraining horizontal displacement; such is not specifically defined by the present disclosure.

Figure 13:
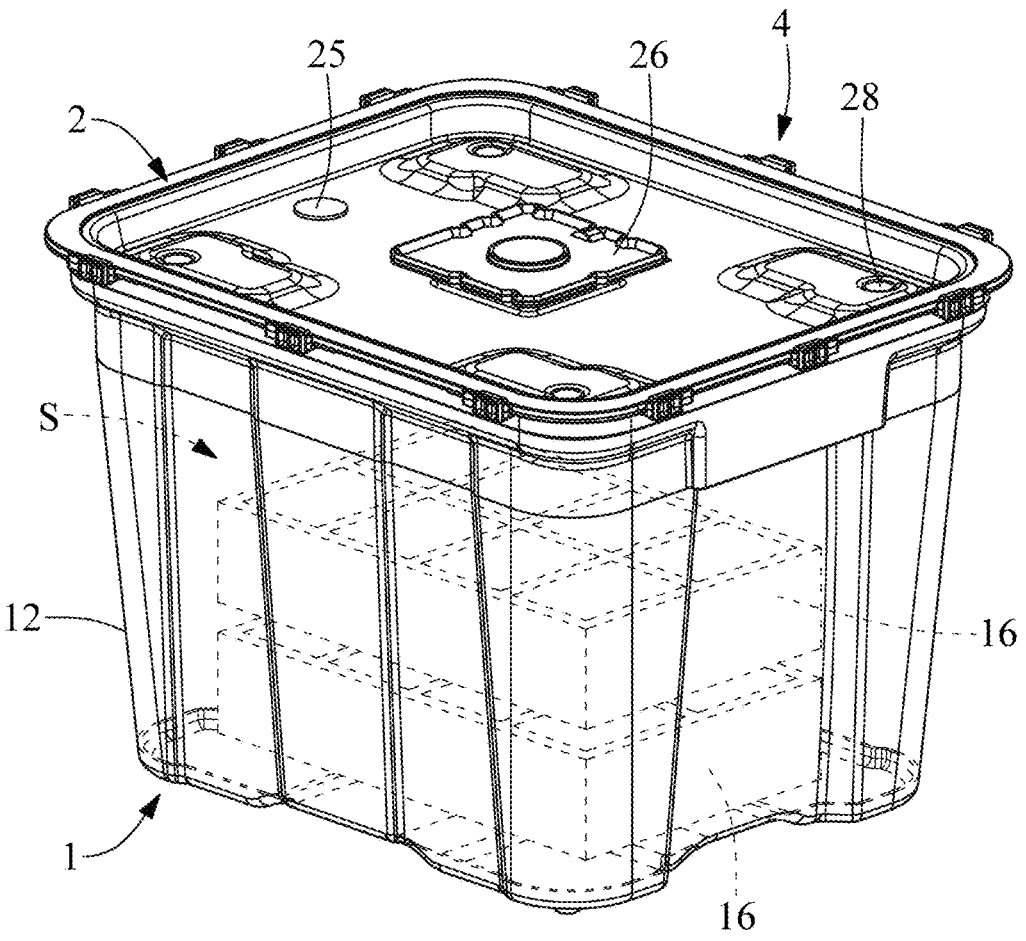
FIG. 13 is a perspective structural schematic diagram of a lower container having a separator therein according to an embodiment of the present disclosure.

Referring to FIG. 13, in addition to the embodiments above, in one embodiment of the present disclosure, the lower container 1 can have at least one separator 16 therein, wherein the separator 16 can be, for example, a separating plate and/or a separating box. The separator 16 can be similarly made of a low moisture absorption material, for example, LCP, COP or metal. Thus, the lower container 1 of this embodiment can separate various semiconductor workpieces therein by the separator 16, for example, carriers and/or parts, so as to prevent contact and contamination between the semiconductor workpieces.

Referring to FIG. 2, FIG. 3 and FIG. 5, in addition to the embodiments above, in one embodiment of the present disclosure, a plurality of fastening structures 4 can be disposed around a junction between the upper cover 2 and the lower container 1, for example, on an outer periphery of the surrounding edge 22 of the upper cover 2 and an outer periphery of the top edge of the lower container 1. Thus, when the upper cover 2 is joined with the lower container 1 in this embodiment, the fastening structures 4 can be further locked to maintain the stable joining of the upper cover 2 with the lower container 1 without leaving the two to separate from each other easily; more particularly, the upper cover 2 is prevented from loosening during automatic gripping of the semiconductor workpiece transport pod. To open the upper cover 2, it should be noted that the fastening structures 4 should be first switched to an unlocked state. The fastening structures 4 are not limited to a specific quantity, and one or more fastening structures 4 can be provided according to actual requirements. The form of the fastening structures 4 is likewise not limited to that disclosed in the drawings, and any equivalent structures capable of achieving locking and unlocking are also applicable.

It should be noted that, in addition to being suitable for accommodating wafer transport pods, the semiconductor workpiece transport pod of the present disclosure is also suitable for semiconductor transport carriers such as reticle carriers, substrate carriers and board carriers, related parts, or any semiconductor workpieces requiring high cleanliness, hence providing excellent practicability.

The present disclosure is described by way of the preferred embodiments above. A person skilled in the art should understand that, these embodiments are merely for illustrating the present disclosure and are not to be construed as limitations to the scope of the present disclosure. It should be noted that all equivalent changes, replacements and substitutions made to the embodiments are encompassed within the scope of the present disclosure. Therefore, the legal protection for the present disclosure should be defined by the appended claims and be in accordance with the broadest interpretation of the claims, so as to encompass all modifications, similar arrangements and processes.

What is claimed is:

1. A semiconductor workpiece transport pod, comprising:
a lower container, having a top opening;
an upper cover, having at least one lateral surrounding groove; and
at least one airtight strip, having a base and at least one skirt, the base accommodated in the lateral surrounding groove, the skirt connected to the base and extending outward,
wherein when the upper cover is joined with the top opening of the lower container, the skirt of the airtight strip is elastically bent and tightly presses against an inner sidewall of the lower container to form airtightness, and
wherein the skirt of the airtight strip is two in quantity, and the two skirts are vertically spaced from each other; when the upper cover is joined with the top opening of the lower container, a second distance is present between an outer surface of the base and the inner sidewall of the lower container; when the two skirts of the airtight strip are not bent, a third distance is present between free ends of the two skirts, and the third distance is greater than or equal to the second distance.

2. The semiconductor workpiece transport pod according to claim 1, wherein the upper cover has a surrounding edge and a lower protrusion, the surrounding edge covers a top edge of the lower container, the lower protrusion extends downward from the surrounding edge, and the lateral surrounding groove is disposed at a periphery of the lower protrusion.

3. The semiconductor workpiece transport pod according to claim 2, wherein the upper cover has an overhead hoist transfer (OHT) chuck, which protrudes from a top surface of the lower protrusion.

4. The semiconductor workpiece transport pod according to claim 3, wherein the lower protrusion and the OHT chuck are connected and formed integrally, the upper cover has a flat portion, and the OHT chuck is located at a central position of the flat portion.

5. The semiconductor workpiece transport pod according to claim 1, wherein the lower container has a plurality of first stacking portions, the upper cover has a plurality of second stacking portions, and the plurality of first stacking portions and the plurality of second stacking portions are matched with and stacked on one another such that a plurality of the semiconductor workpiece transport pods having a same structure are stacked up and stand on one other.

6. The semiconductor workpiece transport pod according to claim 1, wherein the skirt has a sloped surface which rises relative to a horizontal surface of the base.

7. The semiconductor workpiece transport pod according to claim 1, wherein the lower container has an accommodating chamber therein, the upper cover is provided with an air valve assembly, and a portion of the air valve assembly is inserted into the accommodating chamber and is operable to discharge air in the accommodating chamber or provide airtightness.

8. The semiconductor workpiece transport pod according to claim 7, wherein the air valve assembly comprises an air valve mouth and an air valve plug, and opening or closing of the air valve plug is operable to control air discharge or airtightness of the air valve mouth.

9. The semiconductor workpiece transport pod according to claim 8, wherein the air valve mouth has a channel in communication with the accommodating chamber, a surrounding wall of the channel is provided with a plurality of notches, the air valve plug is operable to coordinate with the channel so as to be opened or provide airtightness, and a total length of the channel is less than a total length of the air valve plug.

10. The semiconductor workpiece transport pod according to claim 1, wherein a sidewall of the lower container is expanded in an inclined manner from bottom to top for stacking a plurality of the lower containers having a same structure.

11. The semiconductor workpiece transport pod according to claim 1, wherein the lower container has at least one parts placement region therein.

12. The semiconductor workpiece transport pod according to claim 1, wherein the lower container has at least one separator therein, and a material of the separator is liquid crystal polymer (LCP), cyclo olefin polymer (COP) or metal.

13. The semiconductor workpiece transport pod according to claim 1 further comprises:

a plurality of fastening structures, which can be disposed around a junction between the upper cover and the lower container, operable to lock, open and close the upper cover and the lower container.

14. The semiconductor workpiece transport pod according to claim 1, wherein a material of each of the lower container and the upper cover is liquid crystal polymer (LCP), cyclo olefin polymer (COP) or metal.

* * * * *